United States Patent [19]
Kimura

[11] Patent Number: 6,157,334
[45] Date of Patent: Dec. 5, 2000

[54] DIGITAL-ANALOG CONVERTER, CIRCUIT BOARD, ELECTRONIC DEVICE AND LIQUID CRYSTAL DISPLAY DEVICE

[75] Inventor: Mutsumi Kimura, Suwa, Japan

[73] Assignee: Seiko Epson Corporation, Tokyo, Japan

[21] Appl. No.: 09/088,844

[22] Filed: Jun. 2, 1998

[30] Foreign Application Priority Data

Jun. 2, 1997 [JP] Japan .................................... 9-159220
Mar. 11, 1998 [JP] Japan .................................. 10-060006

[51] Int. Cl.$^7$ ........................................................ H03M 1/80
[52] U.S. Cl. ............................................ 341/153; 341/144
[58] Field of Search ................................... 341/144, 150, 341/153, 154

[56] References Cited

U.S. PATENT DOCUMENTS

| | | | |
|---|---|---|---|
| 4,701,694 | 10/1987 | Penney et al. | 323/317 |
| 5,394,146 | 2/1995 | Arimoto | 341/118 |
| 5,614,905 | 3/1997 | Crane | 341/146 |
| 5,808,576 | 9/1998 | Chloupek et al. | 341/144 |

FOREIGN PATENT DOCUMENTS 5-181436  7/1993  Japan .

*Primary Examiner*—Brian Young
*Assistant Examiner*—Peguy JeanPierre
*Attorney, Agent, or Firm*—Oliff & Berridge, PLC

[57] ABSTRACT

A digital-analog converter, a circuit board, an electronic device, and a liquid crystal display device are provided that make it possible to decrease the number of required resistors and switches and to reduce power consumption. A digital-analog converter that converts plural bits of a digital signal into an analog output, comprises high-potential wiring to which a high potential $V_H$ is supplied, low-potential wiring to which a low potential $V_L$ is supplied, output wiring for obtaining the analog output $V_S$, a first variable resistance block R1 that is provided between the high-potential wiring and the output wiring and has a variable resistance value, and a second variable resistance block R2 that is provided between the output wiring and the low-potential wiring and has a variable resistance value. A ratio of resistance values of the first and second variable resistance blocks R1 and R2 is represented by a ratio of non-negative integers which are natural numbers, whose total sum is equal to a constant, and that change in increments of one based on the digital signals D0 to D2 increasing or decreasing by a minimum unit.

19 Claims, 10 Drawing Sheets

FIG. 3

| DIGITAL SIGNAL | RESISTANCE (Ω) | | Vs(v) | R₁+R₂ (Ω) |
|---|---|---|---|---|
| | R₁ | R₂ | | |
| 0 0 0 | ∞ | 1/8 | 0 | ∞ |
| 0 0 1 | 1 | 1/7 | 1 | 8/7 |
| 0 1 0 | 1/2 | 1/6 | 2 | 2/3 |
| 0 1 1 | 1/3 | 1/5 | 3 | 8/15 |
| 1 0 0 | 1/4 | 1/4 | 4 | 1/2 |
| 1 0 1 | 1/5 | 1/3 | 5 | 8/15 |
| 1 1 0 | 1/6 | 1/2 | 6 | 2/3 |
| 1 1 1 | 1/7 | 1 | 7 | 8/7 |

FIG. 4

| DIGITAL SIGNAL | R₁ : R₂ |
|---|---|
| 0 0 0 | 8 : 0 |
| 0 0 1 | 7 : 1 |
| 0 1 0 | 6 : 2 |
| 0 1 1 | 5 : 3 |
| 1 0 0 | 4 : 4 |
| 1 0 1 | 3 : 5 |
| 1 1 0 | 2 : 6 |
| 1 1 1 | 1 : 7 |

FIG. 8

| DIGITAL SIGNAL | VH(V) | VL(V) | Vs(V) |
|---|---|---|---|
| 0 0 0 0 0 | 8 | 0 | 0 |
| 0 0 0 0 1 | | | 1 |
| 0 0 0 1 0 | | | 2 |
| 0 0 0 1 1 | | | 3 |
| 0 0 1 0 0 | | | 4 |
| 0 0 1 0 1 | | | 5 |
| 0 0 1 1 0 | | | 6 |
| 0 0 1 1 1 | | | 7 |
| 0 1 0 0 0 | 16 | 8 | 8 |
| 0 1 0 0 1 | | | |
| 0 1 0 1 0 | | | |
| 0 1 0 1 1 | | | |
| 0 1 1 0 0 | | | |
| 0 1 1 0 1 | | | |
| 0 1 1 1 0 | | | |
| 0 1 1 1 1 | | | 15 |
| 1 0 0 0 0 | 24 | 16 | 16 |
| 1 0 0 0 1 | | | |
| 1 0 0 1 0 | | | |
| 1 0 0 1 1 | | | |
| 1 0 1 0 0 | | | |
| 1 0 1 0 1 | | | |
| 1 0 1 1 0 | | | |
| 1 0 1 1 1 | | | 23 |
| 1 1 0 0 0 | 32 | 24 | 24 |
| 1 1 0 0 1 | | | |
| 1 1 0 1 0 | | | |
| 1 1 0 1 1 | | | |
| 1 1 1 0 0 | | | |
| 1 1 1 0 1 | | | |
| 1 1 1 1 0 | | | |
| 1 1 1 1 1 | | | 31 |

DIGITAL-ANALOG CONVERTER, CIRCUIT BOARD, ELECTRONIC DEVICE AND LIQUID CRYSTAL DISPLAY DEVICE

BACKGROUND OF THE INVENTION

1. Field of Invention

The present invention relates to a digital-analog converter, a circuit board, an electronic device, and a liquid crystal display device.

2. Description of Related Art

A well-known digital-analog converter in the form of a voltage dividing circuit has serially connected resistors and outputs an analog signal based on an input digital signal. For example, searching the PATOIS of Japan Patent Information Organization with the search formula, ((D/A+digital-analog+(digital*analog))*(C+converter))+(drive*circuit) *resistor*(serial+parallel)*(potential+voltage)* liquid crystal, identified 98 items. In particular, Japanese Unexamined Patent Publication No. 5-181436 was found which discloses a digital-analog converter that has serially connected resistors as discussed above.

According to a conventional digital-analog converter like this, since a voltage dividing circuit is constructed by serially-connected resistors, as shown for example in FIG. 11, it is necessary to provide not only many resistors, but also many switches for the respective resistors. Further, since a current always flows through the serially-connected resistors, power consumption is large. These are problems of the conventional digital-analog converter.

SUMMARY OF THE INVENTION

An object of the present invention is to obtain a digital-analog converter, a circuit board, an electronic device, and a liquid crystal display device that make it possible to decrease the number of resistors and switches and to reduce power consumption.

In order to achieve the above object, a digital-analog converter according to the present invention, which is a digital-analog converter that converts plural bits of a digital signal into an analog signal, comprises:

high-potential wiring to which a high potential is supplied;

low-potential wiring to which a low potential is supplied;

output wiring for outputting the analog signal;

first variable resistance circuitry provided between the high-potential wiring and the output wiring that has a changeable value of resistance; and second variable resistance circuitry provided between the output wiring and the low-potential wiring that has a changeable value of resistance.

According to the present invention, the first variable resistance circuitry is provided between the high-potential wiring and output wiring, and the second variable resistance circuitry is provided between the output wiring and low-potential wiring. Therefore, a voltage dividing circuit is constructed by the first and second variable resistance circuitry, and the potential generated by subtracting a drop in potential from the potential of the high-potential wiring is output on the output wiring based on potentials on the high-potential wiring and the low-potential wiring, and resistance values of the first and second variable resistance circuitry. The output potential obtained is an analog output.

It is preferable that a ratio of resistance values of the first and second variable resistance circuitry is represented by a ratio of non-negative integers which are natural numbers whose total sum is equal to a constant, and that change in increments of one based on the digital signal increasing or decreasing by a minimum unit.

Here, a value of each resistance of the first and second variable resistance circuitry can be written as a ratio of natural numbers whose total sum is kept constant in spite of changes of individual resistance values in the first and second variable resistance circuits. Thus, this can be formulated as follows:

$R1{:}R2=N1{:}N2$, and $N1+N2=C$, where $R1$: Resistance value of first variable resistance circuitry, $R2$: Resistance value of second variable resistor circuitry, $N1$: Variable (non-negative integer), $N2$: Variable (non-negative integer), and $C$: Constant (natural number).

In addition, it is possible to represent these relations so that each non-negative integer $N1$ or $N2$ changes so that the counterpart integer $N1$ or $N2$ increases or decreases by one. For example, if $N1$ changes to 1, 2, or 3, sequentially, $N2$ changes to 3, 2, or 1, sequentially.

As mentioned above, when the resistance value of the first and second variable resistance circuitry changes, the resistance of one circuit increases by 1/(natural number) of the total of both values of resistance, and the resistance of the other circuit decreases by 1/(natural number) of the total of both values of resistance. In this manner, an equally-divided voltage drop occurs in the first variable resistance circuitry. In consequence, it is possible to obtain an analog output that changes at equal intervals since the voltage drop from the high potential wiring changes by an equal division.

One aspect of the invention provides that each of the first and second variable resistance circuits include a plurality of resistance blocks, which are connected in parallel and correspond to respective bits of the digital signal, and that a value of each resistance of the resistance blocks increases at a binary-loaded ratio from the most significant bit to the least significant bit.

Thus, since the resistance blocks are connected in parallel, taking the case of three resistance blocks as an example, a value of each resistance of the first and second variable resistance circuitry is as follows:

$1/R=(1/r1)+(1/r2)+(1/r3)$, where $R$: Resistance value of variable resistance circuitry, and $r1, r2$, and $r3$: Values of resistance of the resistance blocks.

In addition, since a value of resistance of each resistance block increases at the binary-loaded ratio from the most significant bit to the least significant bit, assuming that $r1$ corresponds to the most significant bit, $r1{:}r2{:}r3=2^0{:}2^1{:}2^2$.

From the above-mentioned description, it is possible to obtain a value of resistance that increases or decreases corresponding to a change of the digital signal since the variable resistance circuitry has the resistance blocks loaded in correspondence with respective bits of the digital signal.

In addition, according to the present invention, it is possible to reduce the number of resistors and the number of switches controlling the resistors. Furthermore, power consumption can be reduced. These will be described later in detail in relation to the preferred embodiments.

One aspect of the invention provides that, in a digital-analog converter according to the present invention, each of the first and second variable resistance circuitry includes switches corresponding to respective bits of the digital signal, and that each of these switches switch an electrical connection and disconnection of the respective resistance blocks with an inverting ON and OFF relationship with a corresponding switch in the other of the first and second variable resistance circuitry based on the same bit of the digital signal.

Owing to this, if the value of resistance of one of the first and second variable resistance circuitry increases, the value of resistance of the other circuitry decreases. Thus, a value of the resistance of the first and second variable resistance circuitry changes so that the value of resistance may increase or decrease in the reverse direction according to a value of the digital signal increasing or decreasing.

Moreover, since the resistance values of the resistance blocks are binary-loaded corresponding to bits of the digital signal, it is possible to represent the ratio of the first and second variable resistance circuitry as a ratio of non-negative integers which are natural numbers whose total sum is equal to a constant, and that change in increments of one based on the digital signal increasing or decreasing by the minimum unit. This will be described in detail in relation to the preferred embodiments.

It is also preferable that each of the resistance blocks comprises switching elements that each have a parasitic resistance.

Therefore, it is unnecessary to provide separate resistance blocks since the resistance of the switching element itself is used.

The switching element is preferably a field effect transistor, and it is also preferable that an N-channel field effect transistor and a P-channel field effect transistor in one of the first and second variable resistance circuitry correspond to each other and correspond to respective bits of the digital signal.

In this manner, by having the N-channel field effect transistor and the P-channel field effect transistor correspond to each other, it becomes possible to switch an electrical connection for the resistance blocks with an inverting ON and OFF relationship in the first and second variable resistance circuitry without an additional circuit such as an inverter.

One aspect of the invention provides that the channel width and channel length of the field effect transistors are formed so that a value of resistance corresponding to each bit of the digital signal can be obtained.

Thus, by adjusting the channel width and channel length, it is possible to change the value of resistance of the field effect transistor and obtain the binary-loaded resistance. In addition, the wider the channel width becomes, the less the value of resistance becomes, and the longer the channel length becomes, the larger the value of resistance becomes.

One aspect of the invention provides that one of the first and second variable resistance circuitry has an additional resistance block that is always electrically conducting, and that the value of resistance of this additional resistance block is equal to the value of resistance of the resistance block corresponding to the least significant bit of the digital signal.

Since one of the first and second variable resistance circuitry always has the value of resistance of the additional resistance block, there is no possibility of the value of resistance becoming infinite, that is, output wiring floating. In addition, it becomes possible to obtain the potential of the high-potential wiring or low-potential wiring in an analog output. This will be described in detail in relation to the preferred embodiments.

One aspect of the invention provides that a digital-analog converter has a precharge switch that temporarily connects the output wiring to any one of the high-potential wiring and low-potential wiring and temporarily sets the potential of the output wiring at the high-potential or low-potential.

The analog output can be obtained between the potential of the high-potential wiring and the potential of the low-potential wiring. Therefore, it is possible to instantaneously set the analog output at the highest potential or the lowest potential with the precharge switch. Thus, it is possible to reduce the time necessary for changing the potential on the output wiring to generate the analog output.

One aspect of the invention provides that the digital-analog converter has a potential adjustment device for changing at least one of the high-potential and low-potential.

Thus, it is possible to change a potential range of the analog output. In addition, it is possible to perform potential adjustment in equal divisions even if the potential range of the analog output changes.

A circuit board according to the present invention has the above-mentioned digital-analog converter and a board on which a desired pattern is formed.

An electronic device, including a projection-type display device, according to the present invention has the above-mentioned digital-analog converter.

A liquid crystal display device, which includes a projection-type display device, according to the present invention is a liquid crystal display device having a liquid crystal whose light transmittance can be changed according to an analog output from a digital-analog converter that converts plural bits of a digital signal into the analog signal, wherein the digital-analog converter comprises:

high-potential wiring to which a high potential is supplied;

low-potential wiring to which a low potential is supplied;

output wiring that outputs the analog output;

first variable resistance circuitry that is provided between the high-potential wiring and the output wiring and has a changeable resistance value;

second variable resistance circuitry that is provided between the output wiring and the low-potential wiring and has a changeable resistance value; and a potential adjustment device that changes both of the high potential and low potential, wherein a resistance ratio of the first and second variable resistance circuitry can be represented by a ratio of non-negative integers which are natural numbers whose total sum is equal to a constant, and that change in increments of one according to a value of the digital signal increasing or decreasing by the minimum unit, wherein each of the first and second variable resistance circuitry includes a plurality of resistance blocks that are connected in parallel and correspond to respective bits of the digital signal, wherein a value of resistance of each resistance block increases at a binary-loaded ratio from the most significant bit toward the least significant bit of the digital signal, wherein each of the first and second variable resistance circuitry includes switches that correspond to respective bits of the digital signal, wherein the switches switch an electrical connection and disconnection of each of the resistance blocks with an inverting ON and OFF relationship with a corresponding switch in the other of the first and second variable resistance circuitry based on the same bit of the digital signal, and wherein the potential adjustment device converts both potentials in the high-potential wiring and low-potential wiring into levels corresponding to the maximum and minimum values of a divided potential range partitioned by equally dividing the variation range of the light transmittance, thereby causing the analog output to be in the range of the minimum and maximum values.

According to the present invention, the potential adjustment device converts both potentials in the high-potential wiring and low-potential wiring into a level of an applied voltage corresponding to the minimum and maximum values of one of the divided ranges partitioned by equally dividing the variation range of the light transmittance.

Since the light transmittance and the applied voltage have a nonlinear relationship, the light transmittance does not increase in equal intervals even if the applied voltage is increased in equal intervals. In the present invention, since the potentials of the high-potential wiring and low-potential wiring are changed using the light transmittance as a reference, it is possible to change the light transmittance in equal intervals.

In addition, it is also possible to obtain a desired light transmittance that is not always equal in intervals.

One aspect of the invention provides that each of the resistance blocks comprises switching elements that each have a parasitic resistance.

One aspect of the invention provides that each of the switching elements is a field effect transistor, and that an N-channel field effect transistor and a P-channel field effect transistor in one of the first and second variable resistance circuitry correspond to each other and correspond to respective bits of the digital signal.

One aspect of the invention provides that the channel width and channel length of the field effect transistor is formed so that a value of resistance corresponding to each bit of the digital signal can be obtained.

One aspect of the invention provides that the potential adjustment device determines both potentials of the high-potential wiring and low-potential wiring by determining which of the divided ranges the analog signal corresponding to the digital signal corresponds to.

Thus, it becomes possible to obtain an analog signal with which the light transmittance of a liquid crystal corresponds to the digital signal.

One aspect of the invention provides that one of the first and second variable resistance circuitry has an additional resistance block and the value of resistance of this additional resistance block is equal to the value of resistance of the resistance block corresponding to the least significant bit of the digital signal.

BRIEF DESCRIPTION OF THE DRAWINGS

Hereinafter, embodiments of the present invention will be described with reference to the drawings.

FIG. 3 is a table presenting relation between the digital signal, the value of resistance of the first and second variable resistance blocks R1 and R2, the total value of both values of resistance, and the potential of the analog output in the first embodiment;

FIG. 4 is a table presenting values of resistance of variable resistance blocks in the first embodiment in the ratio;

FIG. 8 is a table presenting an example of changing potential with a potential adjusting block in the fourth embodiment;

DETAILED DESCRIPTION OF PREFERRED EMBODIMENTS

Figure 1:
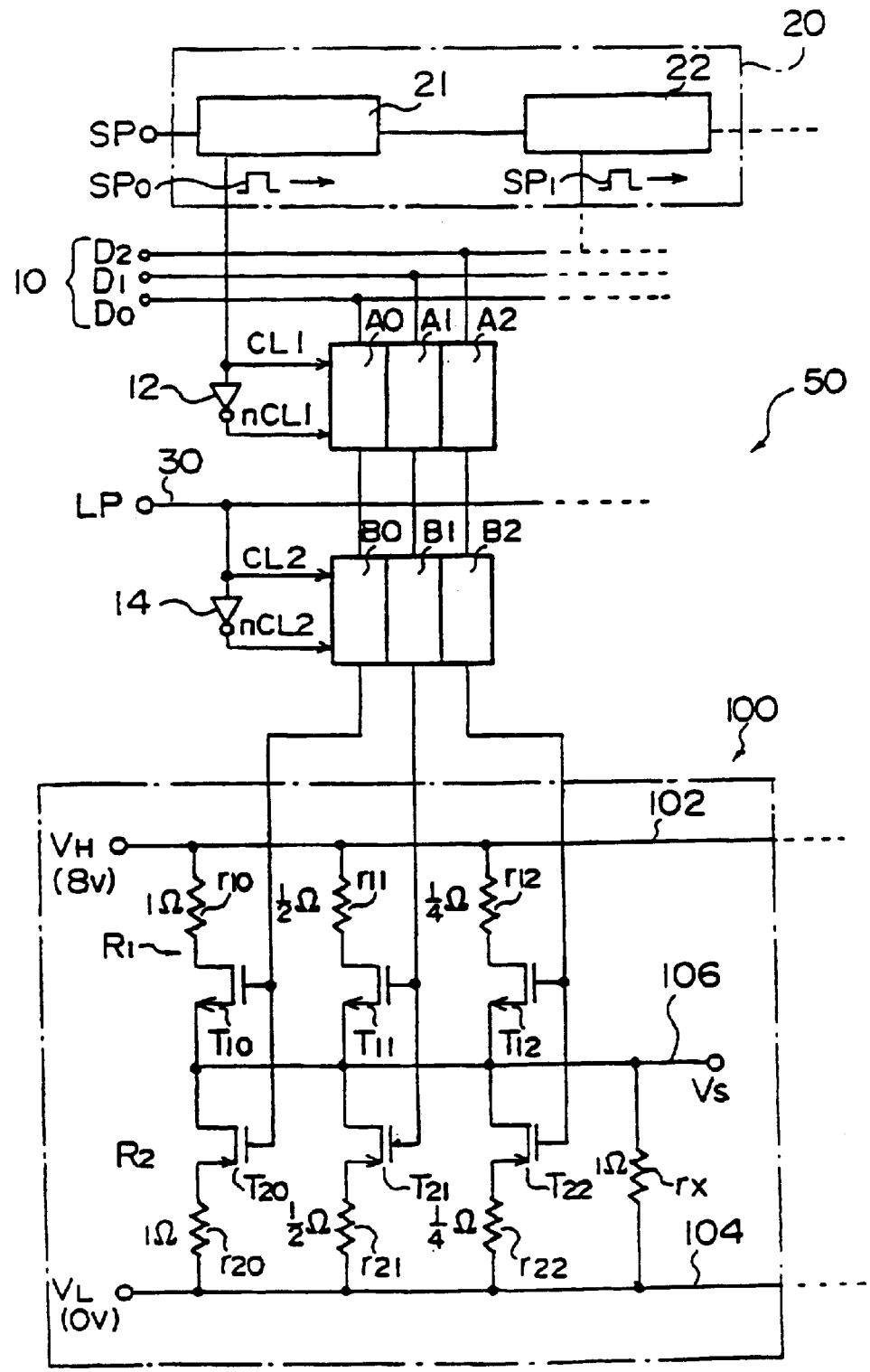
FIG. 1 is a circuit diagram showing a drive circuit for a liquid crystal display device according to a first embodiment of the present invention.
Figure 2:
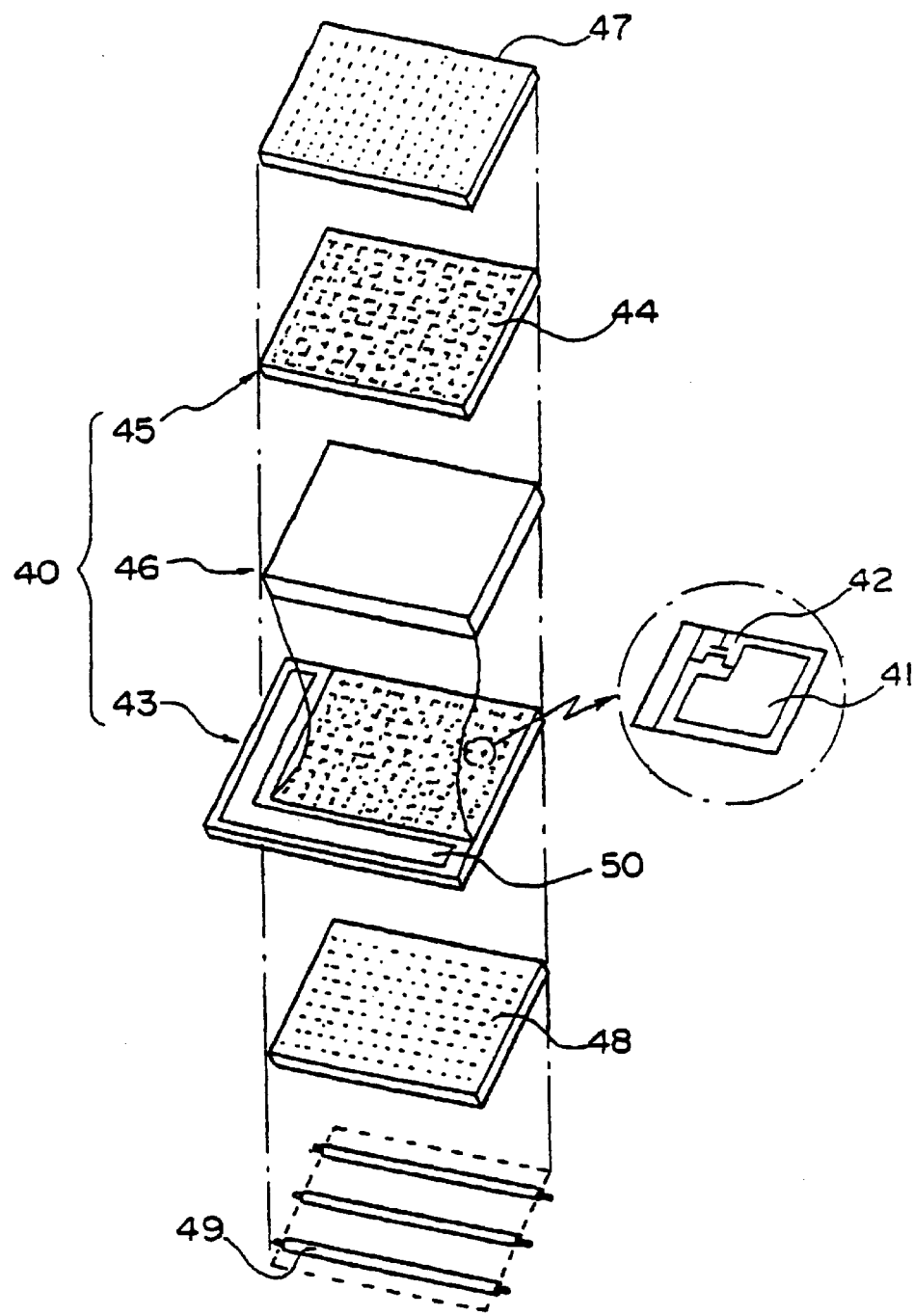
FIG. 2 is an exploded perspective view of a liquid crystal display device according to the first embodiment.

FIG. 1 shows a drive circuit for a liquid crystal display device according to a first embodiment. In addition, FIG. 2 shows an exploded perspective view of a liquid crystal display device. As shown in FIG. 2, this liquid crystal display device has an active matrix type liquid crystal panel 40. The liquid crystal panel 40 is formed by sealing liquid crystal 46 between a TFT substrate 43 having thin film transistors 42 each controlling supply of a potential to a pixel electrode 41, and a color filter substrate 45 having counter electrodes 44. In addition, polarizers 47 and 48 are attached to both surfaces of the liquid crystal panel 40, and a back light 49 is attached to one side of the polarizer 48. Furthermore, a drive circuit 50 is formed on the TFT substrate 43.

The drive circuit 50, as shown in FIG. 1, includes a digital-analog conversion circuit 100 according to the present invention. The digital-analog conversion circuit 100 can convert a 3-bit digital signal into an analog voltage. Although, in this embodiment, the 3-bit-ready digital-analog conversion circuit 100 is used for simple explanation, a 3-or-more-bit-ready digital-analog conversion circuit is necessary so as to display a sharp image.

In addition, circuits on the TFT substrate 43 are made of polysilicon formed in a low temperature process.

In FIG. 1, digital signals D0 to D2 are inputted to three lines of digital wiring 10 respectively. The digital signals D0 to D2 are held in latching circuits A0 to A2 according to a clock CL1 and an inverted clock nCL1.

A shift register 20 has registers 21, 22, . . . whose stages correspond to the line count of signal lines of the liquid crystal display device, each of which outputs a sampling pulse SP as a clock CL1. A signal level of the sampling pulse SP is inverted by an inverter 12, and the inverted clock nCL1 is generated.

The latching circuits A0 to A2 correspond to each of the registers 21, 22, . . . If signals are held in the latching circuits A0 to A2, all of the signals are shifted to a next stage of latching circuits B0 to B2. The signals are stored in the latching circuits B0 to B2 based on a clock CL2 and an inverted clock nCL2 that are input to the latching circuits B0 to B2.

A latching pulse LP is input as the clock CL2 to latching pulse wiring 30. A signal level of the latching pulse LP is inverted by an inverter 14, and the inverted clock nCL2 is generated.

If the signals are shifted to the next stage of latching circuits B0 to B2, digital-analog conversion is performed according to these signals. During this processing, a next set of signals can be sequentially input to the latching circuits A0 to A2 corresponding to each of registers 21, 22.

The signals held in the latching circuits B0 to B2 are input to the digital-analog conversion circuit 100.

The digital-analog conversion circuit 100 includes high-potential wiring 102 having a potential $V_H$, low-potential wiring 104 having a potential $V_L$, and output wiring 106 having a potential $V_S$. The potential $V_H$ and potential $V_L$ are related as follows:

$$V_L<V_H$$

Potentials of the high-potential wiring 102 and low-potential wiring 104 are maintained at potential $V_H$ and potential $V_L$, respectively. In this embodiment, the potential $V_H$ is 8 V, and the potential $V_L$ is 0 V.

The potential $V_S$, which is converted according to the digital signals D0 to D2, is output on the output wiring 106. For performing digital-analog conversion, the digital-analog conversion circuit 100 has variable resistance blocks R1 and R2 whose values of resistance can be changed.

The variable resistance block R1 is connected between the high-potential wiring 102 and the output wiring 106, and has resistors r10 to r12 and switches T10 to T12. The resistors r10 to r12 are connected in parallel between the high-potential wiring 102 and the output wiring 106. In addition, resistors r10 to r12 are connected to the switches T10 to T12 so that electrical connection and disconnection can be performed between the high-potential wiring 102 and the output wiring 106. Thus, the resistor r10 and switch T10, which are connected serially, the resistor r11 and switch T11, which are connected serially, and the resistor r12 and switch T12, which are connected serially, are connected in parallel between the high-potential wiring 102 and the output wiring 106. The parasitic resistance of the switches T10 to T12 is negligible.

The switches T10 to T12 are each an N-channel MOS FET (Field Effect Transistor) and gates of the transistors T10 to T12 are connected to the latching circuits B0 to B2, respectively. Therefore, the switches T10 to T12 control current flowing in the resistors r10 to r12, according to the digital signals D0 to D2. Furthermore, the MOS FETs of switches T10 to T12 are thin film transistors.

The variable resistance block R2 is connected between the output wiring 106 and low-potential wiring 104, and has an additional resistor rx in addition to the resistors r20 to r22 and switches T20 to T22.

The resistors r20 to r22 are connected in parallel between the output wiring 106 and low-potential wiring 104. In addition, the resistors r20 to r22 are connected to the switches T20 to T22 so that electrical connection and disconnection can be performed between the output wiring 106 and the low-potential wiring 104. Thus, the resistor r20 and switch T20, which are connected serially, the resistor r21 and switch T21, which are connected serially, and the resistor r22 and switch T22, which are connected serially, are connected in parallel between the output wiring 106 and the low-potential wiring 104. The parasitic resistance of the switches T20 to T22 is negligible.

Similar to the above-mentioned switches T10 to T12, the switches T20 to T22 are each a MOS FET (Field Effect Transistor) and gates of the transistors are connected to the latching circuits B0 to B2, respectively. Therefore, the switches T20 to T22 control current flowing in the resistors r20 to r22, according to the digital signals D0 to D2.

In contrast to the N-channel MOS FETs of the switches T10 to T12, the switches T20 to T22 are each a P-channel MOS FET (Field Effect Transistor). Therefore, the switches T10 to T12 and switches T20 to T22 are alternately switched ON and OFF relative to each other. That is, the switches operate in an inverting ON and OFF relationship such that when the switch T10 is ON, the switch T20 is OFF. Furthermore, the MOS FETs of the switches T20 to T22 are thin film transistors.

It is advantageous that the switches T10 to T12 are P-channel MOS FETs and the switches T20 to T22 are N-channel MOS FETs. The switches T10 to T12 and T20 to T22 operate quite similarly except that the logic of the digital control signal is inverted. Furthermore, it is advantageous that the resistors r10 to r12 and switches T10 to T12, or the resistors r20 to r22 and switches T20 to T22 are switched alternately. According to this construction, it becomes possible to reduce parasitic resistance at the time of a switch being ON and to perform more accurate digital-analog conversion.

The additional resistor rx is connected without a switch between the output wiring 106 and the low-potential wiring 104 so that the resistance is always conductive.

In the digital-analog conversion circuit 100, the resistance values of the resistors r10 to r12, r20 to r22, and rx have the following characteristics.

First, the resistance values of the resistors r10 to r12 have binary-loaded ratios. In addition, the values of resistance increase from the resistor r12 corresponding to the digital signal D2 of the most significant bit to the resistor r10 corresponding to the digital signal D0 of the least significant bit as follows:

$$r10:r11:r12=2^2:2^1:2^0.$$

In addition, when the resistance values are inverted, the values of the inverted resistance values increase from the resistor r10 corresponding to the digital signal D0 of the least significant bit to the resistor r12 corresponding to the digital signal D2 of the most significant bit as follows:

$$1/r10:1/r11:1/r12=2^0:2^1:2^2.$$

The resistance values of the resistors r20 to r22 have binary-loaded ratios as follows:

$$r20:r21:r22=2^2:2^1:2^0, \text{ and}$$

$$1/r20:1/r21:1/r22=2^0:2^1:2^2.$$

Preferably, in this embodiment, the resistance values are as follows:

$$r10=r20=1\Omega,$$

$$r11=r21=1/2\Omega, \text{ and}$$

$$r12=r22=1/4\Omega.$$

The additional resistor rx has the same value of resistance as that of the resistors r10 and r20 corresponding to the digital signal D0 of the least significant bit, that is, 1Ω.

Since the digital-analog conversion circuit 100 is constructed as described above, the ratio of the resistances of the variable resistance block R1 and variable resistance block R2 has a predetermined relation. This will be described with reference to FIG. 3. FIG. 3 shows the relation between the resistance values of the variable resistance block R1, the resistance values of the variable resistance block R2, the total of values of resistance that both variable resistance blocks have, and the potential $V_S$ of the analog output.

In FIG. 3, assuming that the digital signal is, for example, 000, all of the switches T10 to T12 are turned off, and hence the resistance value of the variable resistance block R1 is infinite.

When the digital signal is 001, the switch T10 is turned on, and the switches T11 and T12 are turned off, and hence the resistance value of the variable resistance block R1 is:

$$1/R1=1/r10.$$

Here, substituting r10=1,
R1=1.

On the other hand, if the digital signal is 001, the switches T20 to T22 perform inverse switching to the switches T10 to T12, and hence the switch T20 is turned off, and the switches T21 and T22 are turned on. The value of resistance of the variable resistance block R2 can be obtained by adding the value of resistance of the additional resistor rx to the total of them as follows:

$$1/R2=(1/r21)+(1/r22)+(1/rx).$$

Hence, substituting r21=1/2, r22=1/4, and rx=1,
R2=1/7.

Performing a similar calculation, the ratio between the variable resistance blocks R1 and R2 is as shown in FIG. 3.

FIG. 4 is a table presenting the ratio of the resistance values of the variable resistance blocks R1 and R2. As shown in the figure, the ratio of the resistance values of the variable resistance blocks R1 and R2 can be represented by a ratio of natural numbers whose sum is eight for the entire range of digital signals 001 to 111.

In addition, if a value of the digital signal increases or decreases by one, the ratio of the resistance values of the variable resistance blocks R1 and R2 inversely increases or decreases by one respectively.

For example, if the digital signal changes to 010 from 001, the resistance ratio between the variable resistance blocks R1 and R2 changes to 6:2 from 7:1. Thus, the variable resistance block R1 decreases by one, and the variable resistance block R2 increases by one.

In this embodiment, a total value of 8 as an extreme and a mean of the resistance ratio of the variable resistance blocks R1 and R2 is the number of dividing potential difference of the voltage division circuit. Thus, the variable resistance blocks R1 and R2 construct a voltage division circuit that divides the potential difference between the potential $V_H$ of the high-potential wiring 102 and the potential $V_L$ of the low-potential wiring 104 into eight.

The total value of 8 as an extreme and a mean of the ratio is set because the potential difference between the potential $V_H$ of the high-potential wiring 102 and the potential $V_L$ of the low-potential wiring 104 is 8 V. Since the 8 V of potential difference is divided into eight, it is possible to obtain a voltage dividing circuit that can increase or decrease an output voltage by 1 V.

In addition, according to this embodiment, as shown in FIG. 3, the total (R1+R2) of the variable resistance blocks R1 and R2 decreases as the analog output $V_S$ goes from the maximum or minimum toward an intermediate value. Thus, when the analog output $V_S$=4 V, the total becomes R1+R2= 1/2Ω, that is, the minimum, and the total increases as the digital signal (analog signal) increases or decreases.

Therefore, according to this embodiment, since the digital-analog conversion is performed using high resistance to obtain the maximum or minimum potential to generate the analog output $V_S$, power consumption can be reduced. Furthermore, since the digital-analog conversion is performed using low resistance when the analog output $V_S$ is not equal to the maximum or minimum potential, sufficient charging can be quickly performed.

Figure 11:
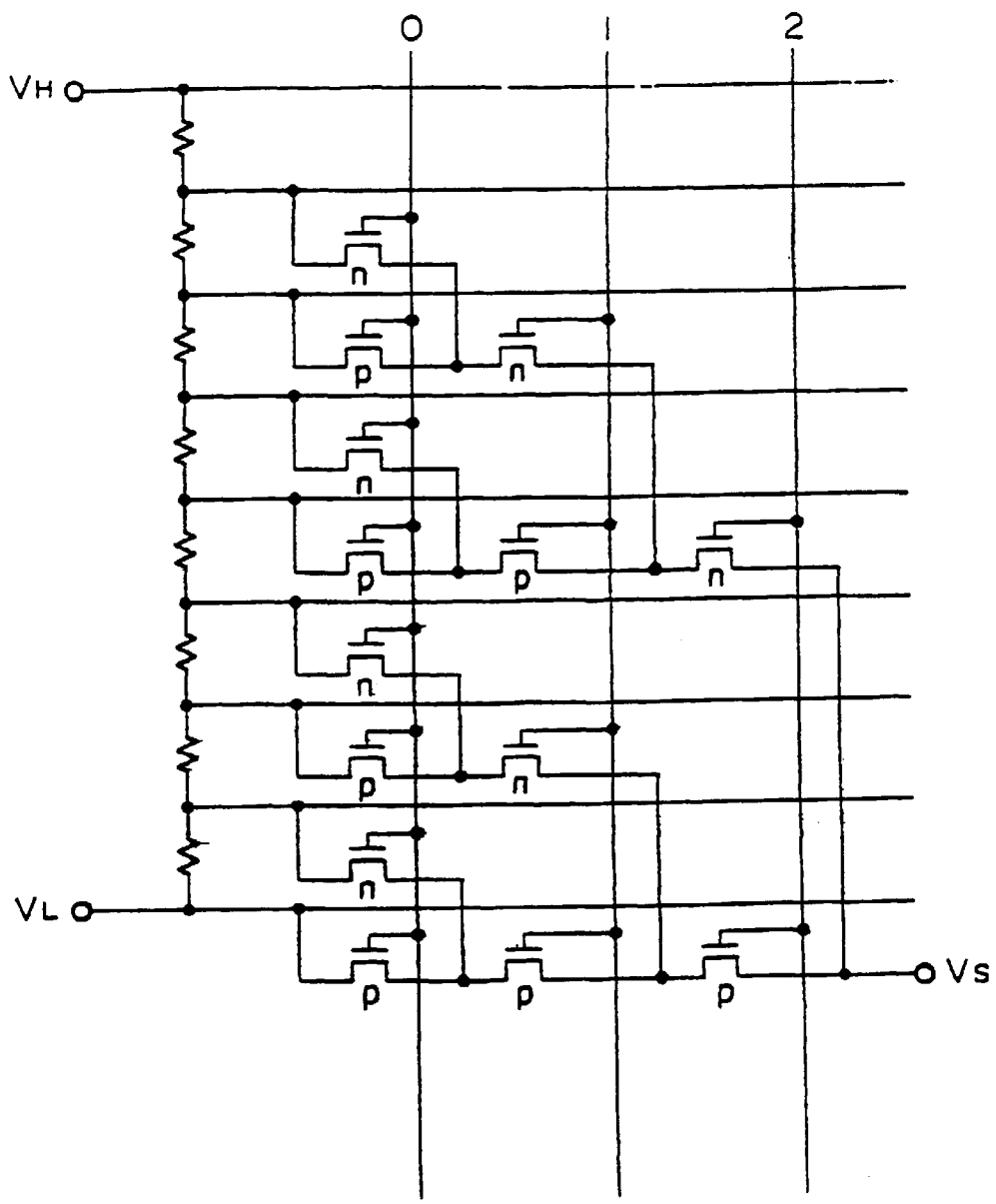
FIG. 11 is a circuit diagram showing a conventional digital-analog conversion circuit.

In this embodiment, the number of resistors is seven, and the number of TFTs is six. This is in contrast to the device disclosed in Japanese Unexamined Patent Publication No. 5-181436, as shown in FIG. 11, in which the number of serially connected resistors is 8, and the number of TFTs is 14. It is apparent that the present invention can reduce the numbers of resistors and switches.

The effect of reducing the numbers of resistors and switches becomes remarkable when the bit count of the digital signal is large. For example, if the bit count is 6 bits, the number of resistors is 13 and the number of TFTs is 12 according to the present invention. Using the method of connecting resistors serially as shown in FIG. 11, however, the number of resistors is 64 and the number of TFTs is 126.

Figure 5:
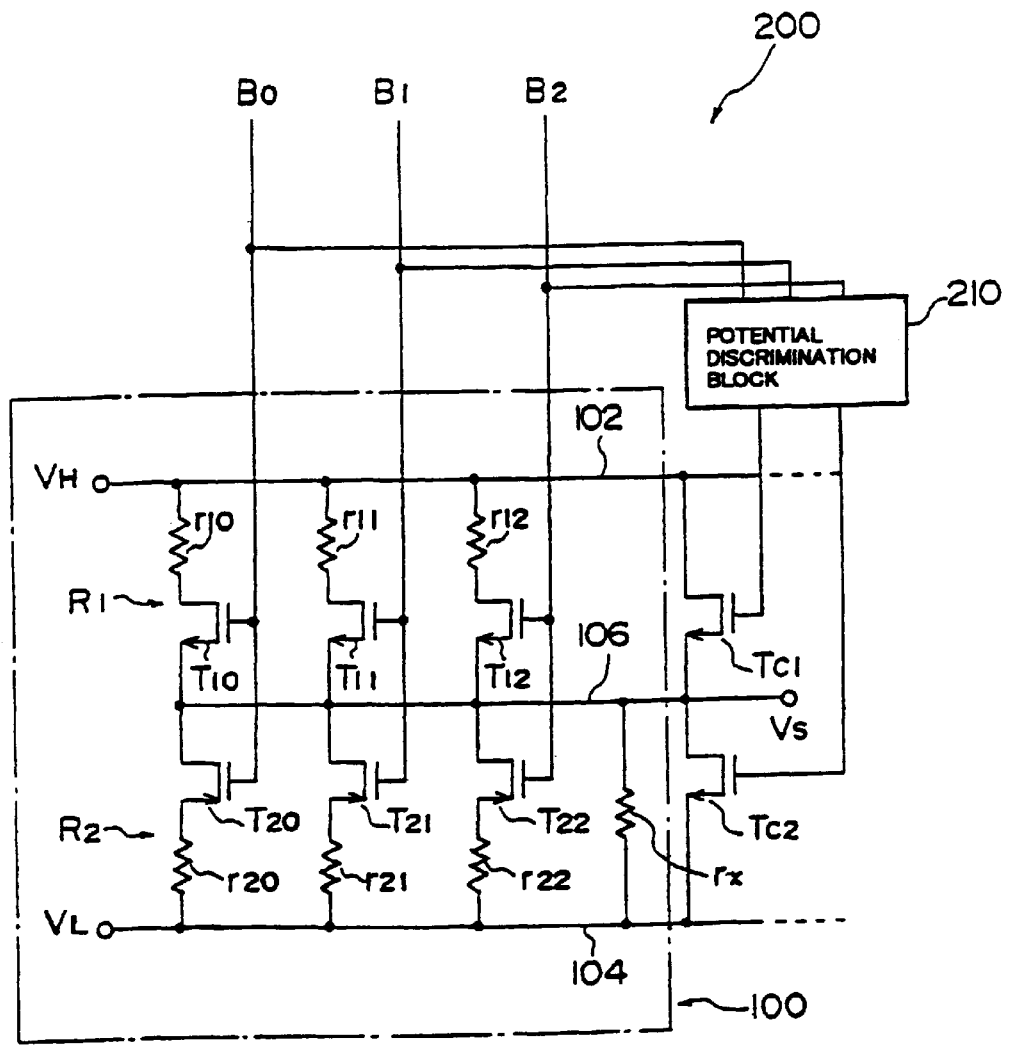
FIG. 5 is a circuit diagram showing a digital-analog conversion circuit according to a second embodiment of the present invention.

FIG. 5 is a circuit diagram showing a digital-analog conversion circuit according to a second embodiment. This digital-analog conversion circuit 200 is formed by adding a potential discrimination block 210 and precharge switches Tc1 and Tc2 to the digital-analog conversion circuit 100.

The precharge switch Tc1 is provided between the high-potential wiring 102 and the output wiring 106, and the precharge switch Tc2 is provided between the output wiring 106 and the low-potential wiring 104.

If the precharge switch Tc1 is turned on and the precharge switch Tc2 is turned off, the analog output $V_S$ of the output wiring 106 becomes the same potential as the potential $V_H$ of the high-potential wiring 102. Therefore, if the analog output $V_S$ corresponding to the digital signal is nearly equal to the potential $V_H$, the analog output $V_S$ is set at the potential $V_H$ in this manner. Then, it is possible to obtain the appropriate analog output $V_S$ using the variable resistance blocks R1 and R2. In this manner, it is possible to quickly cope with a required drastic change in the analog output $V_S$.

On the contrary, if the precharge switch Tc1 is turned off and the precharge switch Tc2 is turned on, the analog output $V_S$ of the output wiring 106 becomes the same potential as the potential $V_L$ of the low-potential wiring 104. Therefore, if the analog output $V_S$ corresponding to the digital signal is nearly equal to the potential $V_L$, the analog output $V_S$ is set at the potential $V_L$ in this manner. Then, it is possible to obtain the appropriate analog output $V_S$ using the variable resistance blocks R1 and R2. In this manner, it is possible to quickly cope with a required drastic change in the analog output $V_S$.

In this embodiment, the potential discrimination block 210 determines which of the potentials $V_H$ and $V_L$ that is nearest the desired analog output $V_S$ based on the digital signal.

The potential discrimination block 210 stores the analog output $V_S$ corresponding to the digital signal. For example, if the values similar to those in the first embodiment are applied, as shown in FIG. 3, the potential discrimination block 210 stores the digital signals 000, 001, . . . , 111 corresponding to the analog outputs $V_S$ 0, 1 . . . , 7(V).

To determine which of the potentials $V_H$ and $V_L$ that is nearest the desired analog output $V_S$, the potential discrimination block 210 inputs the digital signals D0 to D2 from the latching circuits B0 to B2.

For example, an absolute value A that is the difference between the analog output $V_S$ and potential $V_H$, and an absolute value B that is the difference between the analog output $V_S$ and potential $V_L$ are calculated. If A<B, an H level signal is generated, and if B<A, an L level signal is generated. If A=B, either an H level or an L level signal is generated.

For example, if the values similar to those in the first embodiment are applied, an L level signal is generated for the digital signals 000 and 011, and an H level signal is generated for the digital signals 100 to 111. In this case, the potential discrimination block 210 can perform discrimination only using the most significant bit.

If the H level signal is generated, the precharge switch Tc1 is turned on, the precharge switch Tc2 is turned off, and the analog output $V_S$ is set at the potential $V_H$.

On the other hand, if the L level signal is generated, the precharge switch Tc1 is turned off, the precharge switch Tc2 is turned on, and the analog output $V_S$ is set at the potential $V_L$.

In this manner, once the analog output $V_S$ is set at the potential $V_H$ or $V_L$, both of the precharge switches Tc1 and Tc2 are turned off, and the digital-analog conversion is performed by the variable resistance blocks R1 and R2.

According to this embodiment, the analog output $V_S$ is instantaneously set at one of the highest potential $V_H$ or lowest potential $V_L$ by the precharge switches Tc1 and Tc2 having a high driving capability. Then, the analog output $V_S$ is changed corresponding to a value of the digital signal. Therefore, it is possible to instantaneously obtain the desired analog output $V_S$.

As described in the first embodiment, since the digital-analog conversion is performed using high resistance to obtain the maximum or minimum potential to generate the analog output $V_S$, power consumption can be reduced. Since the output wiring 106 is precharged at the maximum or minimum potential, the potential difference to be charged is small, and hence charging can be performed quickly. Moreover, when the analog output $V_S$ is not near the maximum or minimum potential, the digital-analog conversion is performed using low resistance, and hence sufficient charging is quickly performed.

Figure 6:
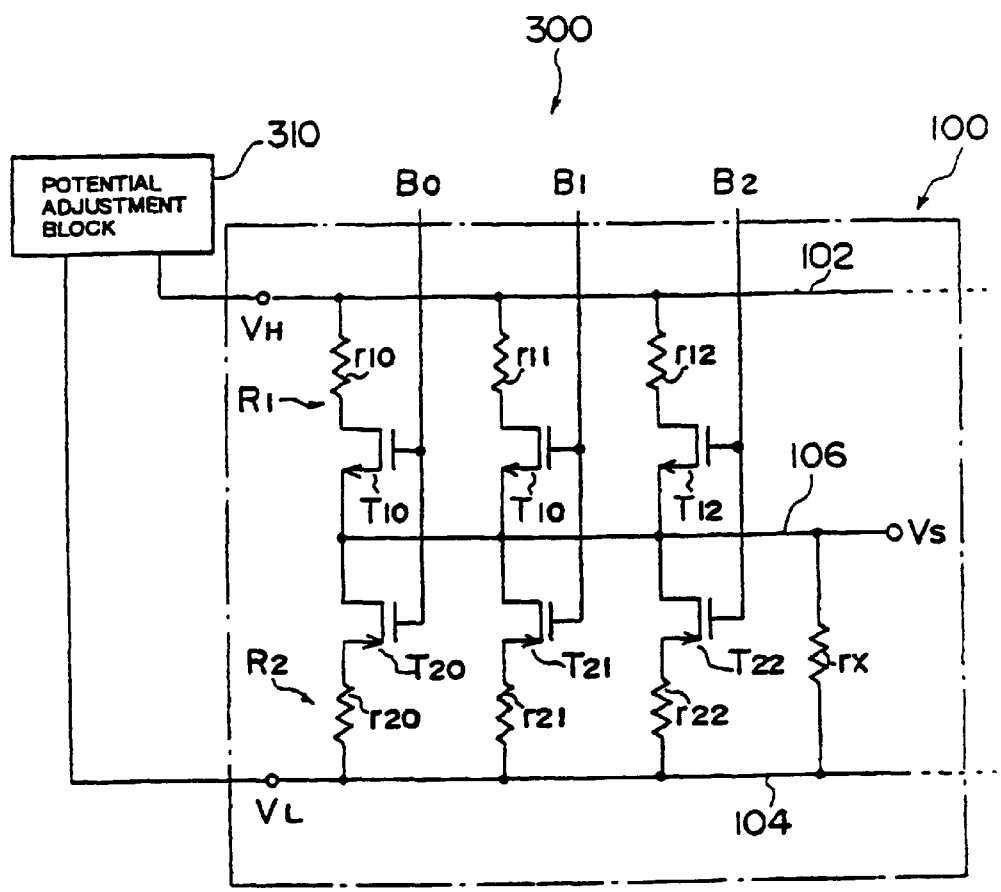
FIG. 6 is a circuit diagram showing a digital-analog conversion circuit according to a third embodiment of the present invention.

FIG. 6 is a circuit diagram showing a digital-analog conversion circuit according to a third embodiment. This digital-analog conversion circuit 300 is formed by adding a potential adjustment block 310 to the digital-analog conversion circuit 100.

The potential adjustment block 310 controls changes of respective potentials $V_H$ and $V_L$ of the high-potential wiring 102 and the low-potential wiring 104. Owing to this, the range of the analog output $V_S$ can be changed.

For example, in the first embodiment, the potential $V_H$ is set at 8 V, the potential $V_L$ is at 0 V, and hence the analog output $V_S$ is changed in the range of 0 to 7 V. If the potential $V_H$ is changed to 16 V and the potential $V_L$ is to 8 V, the analog output $V_S$ is changed in the range of 8 to 15 V. Thus, without changing the construction of the variable resistance blocks R1 and R2, it is possible to obtain the analog output $V_S$ in the range of 0 to 15 V.

Figure 7:
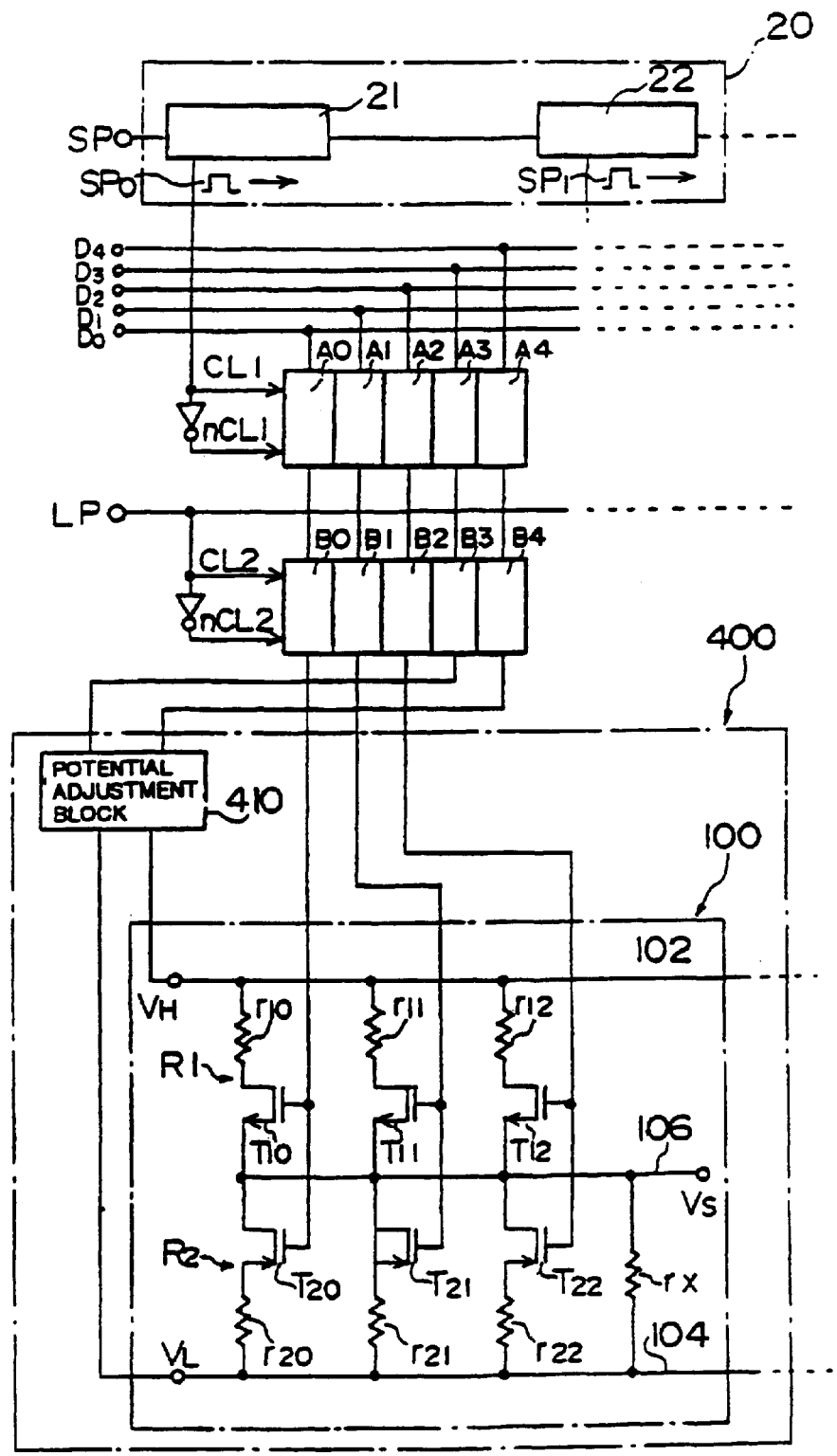
FIG. 7 is a circuit diagram showing a drive circuit of a liquid crystal display device according to a fourth embodiment of the present invention.

FIG. 7 is a circuit diagram showing a drive circuit for a liquid crystal display device according to a fourth embodiment. This drive circuit includes a digital-analog conversion circuit 400. A 5-bit digital signal is input to the digital-analog conversion circuit 400. Digital signals D0 to D4 are input to the digital-analog circuit 400 through the latching circuits A0 to A4 and B0 to B4. Since the latching circuits A0 to A4 and B0 to B4 are the same as that of the latching circuits A0 to A2 and B0 to B2, a detailed description of their structure will be omitted.

The digital-analog conversion circuit 400 is formed by adding a potential adjustment block 410 to the digital-analog conversion circuit 100 shown in FIG. 1. Further, how the low-order 3 bits D0 to D2 of the digital signal are input to the digital-analog conversion circuit 100 is also the same as that in the embodiment shown in FIG. 1.

In this embodiment, the 2 high-order bits of digital signals D3 and D4 are input to the potential adjustment block 410. The potential adjustment block 410 changes the potential $V_H$ of the high-potential wiring 102 and the potential $V_L$ of the low-potential wiring 104 according to the digital signals D3 and D4.

FIG. 8 is a table presenting an example of how the potentials $V_H$ and $V_L$ are changed by the potential adjustment block 410. As shown in the figure, in this embodiment, if the 2 high-order bits of the digital signal are 00, $V_H$=8 and $V_L$=0 and if the 2 high-order bits are 01, $V_H$=16 and $V_L$=8. Further, if the 2 high-order bits of the digital signal are 10, $V_H$=24 and $V_L$=16, and if the 2 high-order bits are 11, $V_H$=32 and $V_L$=24.

In detail, the potential adjustment block 410 judges whether the input digital signals D3 and D4 are 00, and if YES, 8 V is applied to the high-potential wiring 102 and the low-potential wiring 104 is set at 0 V. If NO, the potential adjustment block 410 determines whether the digital signals D3 and D4 are 01, and if YES, 16 V is applied to the high-potential wiring 102 and 8 V is applied to the low-potential wiring 104. If NO, the potential adjustment block 410 determines whether the digital signals D3 and D4 are 10, and if YES, 24 V is applied to the high-potential wiring 102 and 16 V is applied to the low-potential wiring 104. If NO, 32 V is applied to the high-potential wiring 102 and 24 V is applied to the low-potential wiring 104, since the digital signals D3 and D4 are 11.

Owing to this, as shown in FIG. 8, a potential of 0 to 31 V that increases or decreases by 1 V is output as the analog output $V_S$. By means of this potential, a liquid crystal display device can be driven.

According to this embodiment, it is possible to obtain the analog output $V_S$ corresponding to the desired bit count of a digital signal only by changing the construction of the potential adjustment block 410. Since software can be used to implement the potential adjustment block 410, it is easy to change its construction.

In addition, it is also possible to use the digital-analog converter to which the present invention is applied, for the potential adjustment block 410.

Figure 9:
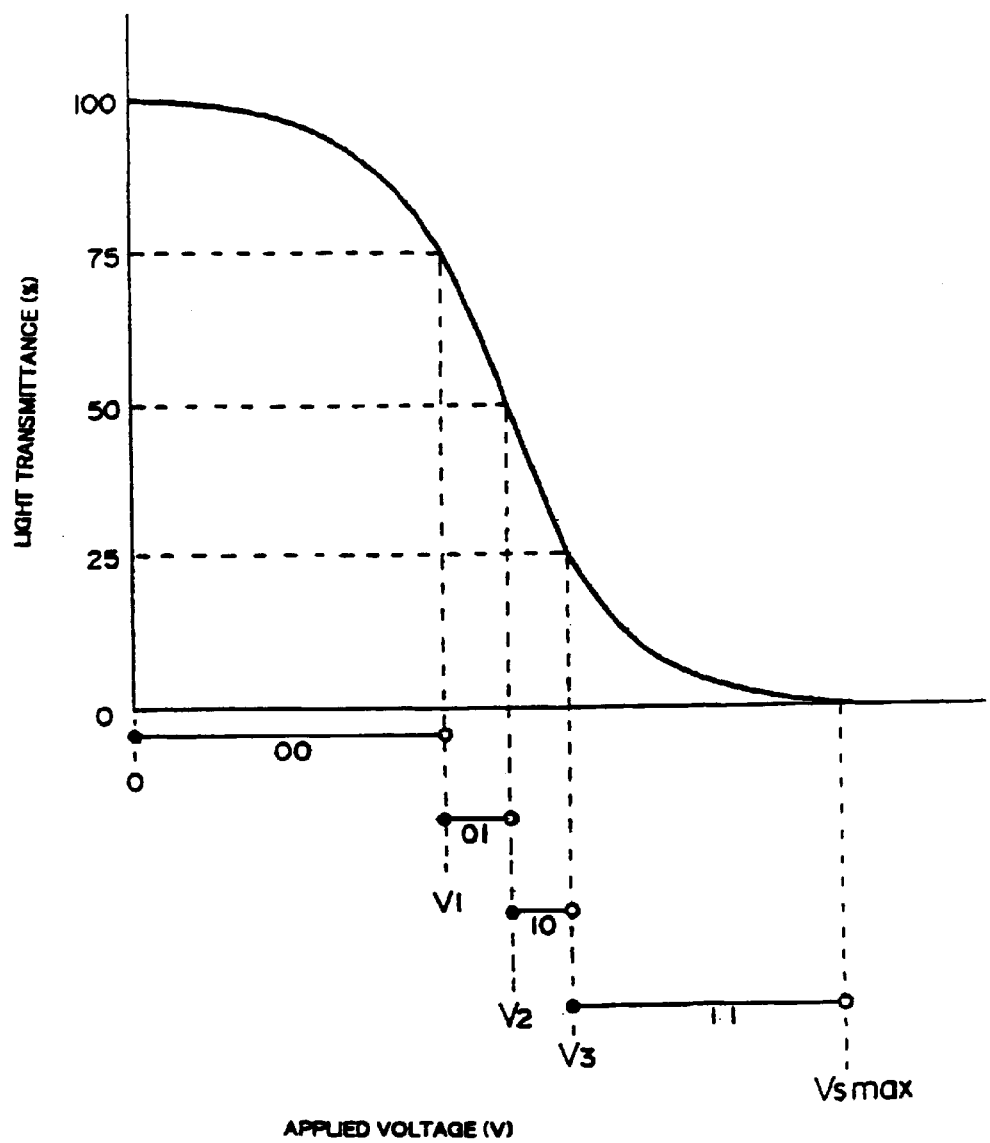
FIG. 9 is a chart of explaining a driving method of a liquid crystal display device according to a fifth embodiment of the present invention.

FIG. 9 is a graph explaining a driving method of a liquid crystal display device according to a fifth embodiment. FIG. 9 shows the relation between the applied voltage to a liquid crystal and the light transmittance of the liquid crystal in the liquid crystal display device. As is apparent from this graph, the relation between the applied voltage and the light transmittance is non-linear. Further, if the applied voltage is increased or decreased at an equal rate, the light transmittance does not increase or decrease at an equal rate, and hence appropriate gray scale can not be obtained in the liquid crystal display device.

In this embodiment, gamma-correction can be performed so as to increase or decrease the light transmittance at an equal rate.

The drive circuit for the liquid crystal display device shown in FIG. 7 is used in this embodiment, and gamma-correction is performed by adjusting the potential $V_H$ and the potential $V_L$ by the potential adjustment block 410.

In detail, the potential adjustment block 410 changes the potential $V_H$ and potential $V_L$ so that a variation range of the light transmittance is equally divided into four and so that the analog output is in the range of an applied voltage corresponding to the minimum and maximum of each divided range. In addition, the reason why the range of the light transmittance is divided into four is that the digital signal corresponding to the potential adjustment block 410 is the 2 high-order bits. If n high-order bits are used in the potential adjustment block 410, the variation range of the light transmittance is divided into $2^n$.

In this manner, the potential $V_H$ and potential $V_L$ are determined, and an analog output $V_S$ corresponding to them is an applied voltage.

Furthermore, it is preferable that a duplicated analog output $V_S$ is not output when the 2 high-order bits of the digital signal are increased or decreased.

Thus, as shown in FIG. 9, it is preferable that, when the 2 high-order bits of the digital signal are 00, the applied voltage (analog output $V_S$) is as follows:

$0 \leq V_S < V1$, and if the 2 high-order bits of the digital signal are 01, the applied voltage is as follows:

$V1 \leq V_S < V2$.

Further, it is also preferable that, if the 2 high-order bits of the digital signal are 10, the applied voltage is as follows:

$V2 \leq V_S < V3$, and if the 2 high-order bits of the digital signal are 11, the applied voltage is as follows:

$V3 \leq V_S < V_{Smax}$.

In this manner, it is possible to eliminate the duplicated analog output $V_S$ and to obtain appropriate gray scale in the liquid crystal display device.

Figure 10:
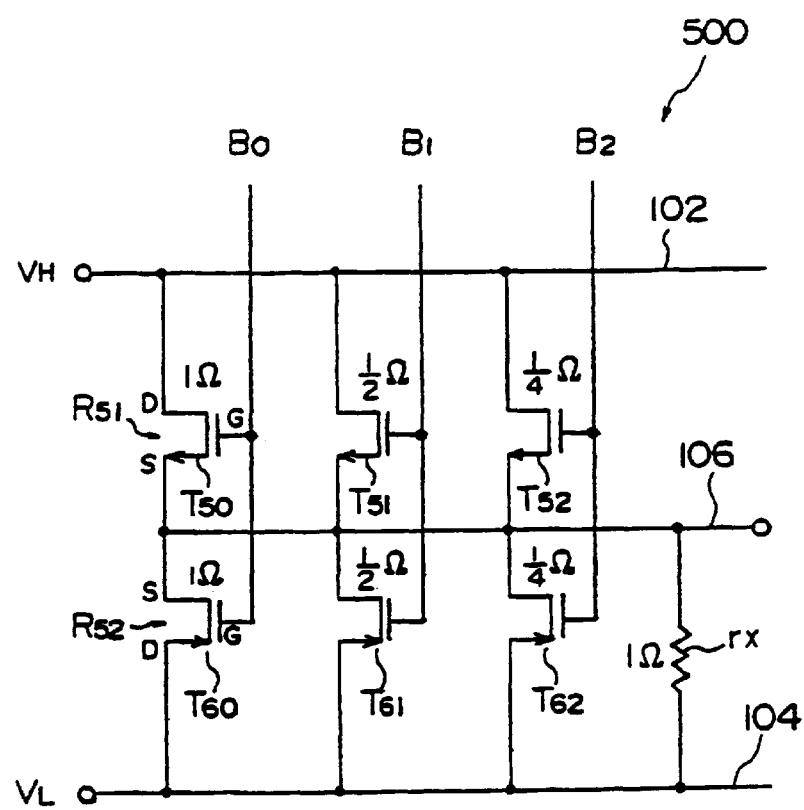
FIG. 10 is a circuit diagram showing a digital-analog conversion circuit according to a sixth embodiment of the present invention.

FIG. 10 is a circuit diagram showing a digital-analog conversion circuit according to a sixth embodiment. This digital-analog conversion circuit 500 can be used with the drive circuit 50 of the first embodiment instead of the digital-analog conversion circuit 100.

The digital-analog conversion circuit 500 is different from the digital-analog conversion circuit 100 in that a variable resistance block R51 is composed of switches T50 to T52 and a variable resistance block R52 is composed of switches T60 to T62. Since the construction of the conversion circuit 500 is the same as that of the digital-analog conversion circuit 100 except for the variable resistance block R51 and R52, the same reference numerals will be assigned and their description will be omitted.

The switches T50 to T52 each are an N-channel MOS FET (Field Effect Transistor), and respective gates are connected to the latching circuits B0 to B2. In addition, a parasitic resistance value between a source and a drain in each of the switches T50 to T52 is equal to the resistance value of the resistors r10 to r12. Thus,

T50:1Ω,

T51:1/2Ω, and

T52:1/4Ω.

Therefore, the switches T50 to T52 fulfill the functions equivalent to those of the switches T10 to T12 and the resistors r10 to r12 in FIG. 1.

On the other hand, switches T60 to T62 each are a P-channel MOS FET (Field Effect Transistor), and respective gates are connected to the latching circuits B0 to B2. In addition, a parasitic resistance value between a source and a drain in each of the switches T60 to T62 is equal to the resistance value of the resistors r20 to r22. Thus,

T60:1Ω,

T61:1/2Ω, and

T62:1/4Ω.

Therefore, the switches T60 to T62 fulfill the functions equivalent to those of the switches T20 to T22 and the resistors r20 to r22 in FIG. 1.

In addition, a parasitic resistance value between a source and a drain in each of the switches T50 to T52 and T60 to T62 can be adjusted by changing the width and length of a current path (channel) in the switches. Thus, if the channel width is increased, a resistance value decreases, and, if the channel length is increased, a resistance value increases.

In this manner, in this embodiment, it is possible to omit resistors as separate members in the variable resistance blocks R51 and R52.

What is claimed is:

1. A digital-analog converter that converts plural bits of a digital signal into an analog output, comprising:

high-potential wiring to which a high potential is supplied;

low-potential wiring to which a low potential is supplied;

output wiring for outputting said analog output based on the plural bits of said digital signal;

first variable resistance circuitry provided between said high-potential wiring and said output wiring that has a variable resistance; and second variable resistance circuitry provided between said output wiring and said low-potential wiring that has a variable resistance, the output wiring outputting said analog output according to potential of the high potential wiring, potential of the low potential wiring, the variable resistance of the first variable resistance circuitry and the variable resistance of the second variable circuitry.

2. The digital-analog converter according to claim 1, wherein a ratio between the resistance values of said first and second variable resistance circuitry is represented by a ratio of non-negative integers whose sum is equal to a constant and that change in increments of one based on said digital signal increasing or decreasing by a minimum unit.

3. The digital-analog converter according to claim 1, wherein each of said first and second variable resistance circuitry includes a plurality of resistance blocks connected in parallel, each of the resistance blocks corresponding to respective bits of said digital signal, and a resistance value of each of said resistance blocks increases at a binary-loaded ratio from a most significant bit to a least significant bit of said digital signal.

4. The digital-analog converter according to claim 3, wherein each of said first and second variable resistance circuitry includes switches that each correspond to respective bits of said digital signal, each of the switches switching an electrical connection in each of said resistance blocks with an inverting ON and OFF relationship with respect to a corresponding switch in the other of said first and second variable resistance circuitry, each group of corresponding switches switching in response to a same bit of the digital signal.

5. The digital-analog converter according to claim 4, wherein each of said resistance blocks comprises switching elements having a parasitic resistance.

6. The digital-analog converter according to claim 5, wherein said switching elements are each a field effect transistor, and an N-channel field effect transistor in one of the first and second variable resistance circuitry corresponds with a P-channel field effect transistor in the other of said first and second variable resistance circuitry, each pair of corresponding field effect transistors corresponding to a bit of said digital signal.

7. The digital-analog converter according to claim 6, wherein a channel width and channel length of said field effect transistors are formed so that a value of resistance corresponding to each bit of said digital signal is obtained.

8. The digital-analog converter according to claim 3, wherein one of said first and second variable resistance circuitry has an additional resistance block that is always electrically conducting, and a value of resistance of the additional resistance block is equal to a value of resistance of said resistance block corresponding to the least significant bit of the digital signal.

9. The digital-analog converter according to claim 3, further comprising a precharge switch that temporarily connects said output wiring to one of said high-potential wiring and said low-potential wiring and temporarily sets a potential of the output wiring at said high-potential or said low-potential.

10. The digital-analog converter according to claim 3, further comprising potential adjustment device that changes at least one of said high-potential and said low-potential.

11. The digital-analog converter according to claim 1, wherein the digital-analog converter is formed on a circuit board substrate.

12. An electronic device comprising the digital-analog converter according to claim 1.

13. A liquid crystal display device, including a liquid crystal having a light transmittance that is changed based on an analog signal output from a digital-analog converter that converts plural bits of a digital signal into the analog signal, wherein said digital-analog converter comprises:

high-potential wiring to which a high potential is supplied;

low-potential wiring to which a low potential is supplied;

output wiring for outputting said analog output;

first variable resistance circuitry that is provided between said high-potential wiring and said output wiring and has a variable resistance and comprises,
  a plurality of resistance blocks connected in parallel, each resistance block corresponding to respective bits of the digital signal, and a value of resistance of each resistance block increasing at a binary-loaded ratio from a most significant bit to a least significant bit, and
  switches corresponding to respective bits of said digital signal, said switches switching an electrical connection in each of said resistance blocks;

second variable resistance circuitry that is provided between said output wiring and said low-potential wiring and has a variable resistance and comprises,
  a plurality of resistance blocks connected in parallel, each resistance block corresponding to respective bits of the digital signal, and a value of resistance of each resistance block increasing at a binary-loaded ratio from a most significant bit to a least significant bit, and
  switches corresponding to respective bits of said digital signal, said switches switching an electrical connection in each of said resistance blocks, each switch in the second variable resistance circuitry corresponding to a switch in the first variable resistance circuitry, each group of corresponding switches operating in an inverting ON and OFF relationship based on a same bit of the digital signal; and a potential adjustment device that changes said high potential and said low potential, said potential adjustment device converting both potentials in said high-potential wiring and said low-potential wiring into levels respectively corresponding to maximum and minimum values of a divided potential range created by equally dividing a variation range of said light transmittance, thereby causing said analog output to be in the range of said minimum value and said maximum value, wherein a resistance ratio of said first and second variable resistance circuitry is represented by a ratio of non-negative integers whose sum is equal to a constant, and that change in increments of one based on said digital signal increasing or decreasing by a minimum unit.

14. The liquid crystal display device according to claim 13, wherein each of said resistance blocks comprises switching elements each having a parasitic resistance.

15. The liquid crystal display device according to claim 14, wherein said switching elements are each a field effect transistor, and an N-channel field effect transistor in one of the first and second variable resistance circuitry corresponds with a P-channel field effect transistor in the other of said first and second variable resistance circuitry.

16. The liquid crystal display device according to claim 15, wherein a channel width and channel length of said field effect transistors are formed so that a value of resistance corresponding to each bit of said digital signal is obtained.

17. The liquid crystal display device according to claim 13, wherein said potential adjustment device determines both potentials of said high-potential wiring and said low-potential wiring by determining which of said divided potential ranges the analog signal corresponding to said digital signal corresponds.

18. The liquid crystal display device according to claim 13, wherein one of said first and second variable resistance circuitry has an additional resistance block that is always electrically conductive, and a value of resistance of this additional resistance block is equal to a value of resistance of a resistance block corresponding to the least significant bit.

19. An electronic device comprising the liquid crystal display device of claim 13.

* * * * *